US011024505B2

United States Patent
Wei et al.

(10) Patent No.: US 11,024,505 B2
(45) Date of Patent: Jun. 1, 2021

(54) GATE STRUCTURE PASSIVATING SPECIES DRIVE-IN METHOD AND STRUCTURE FORMED THEREBY

(71) Applicant: Taiwan Semiconductor Manufacturing Co., Ltd., Hsinchu (TW)

(72) Inventors: Hsiao-Kuan Wei, Longtan Township (TW); Hsien-Ming Lee, Changhua (TW); Chin-You Hsu, Hsinchu (TW); Hsin-Yun Hsu, Taoyuan (TW); Pin-Hsuan Yeh, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/203,832

(22) Filed: Nov. 29, 2018

(65) Prior Publication Data

US 2019/0096681 A1    Mar. 28, 2019

Related U.S. Application Data

(62) Division of application No. 15/824,474, filed on Nov. 28, 2017, now Pat. No. 10,854,459.

(Continued)

(51) Int. Cl.
*H01L 21/28*    (2006.01)
*H01L 29/51*    (2006.01)
(Continued)

(52) U.S. Cl.
CPC .. *H01L 21/28185* (2013.01); *H01L 21/02321* (2013.01); *H01L 21/28556* (2013.01);
(Continued)

(58) Field of Classification Search
None
See application file for complete search history.

(56) References Cited

U.S. PATENT DOCUMENTS 6,429,126 B1 *   8/2002   Herner .............. C23C 16/0281
                                                          257/E21.17
6,451,646 B1 *   9/2002   Lu ............................ C23C 16/34
                                                              438/239

(Continued)

FOREIGN PATENT DOCUMENTS

| TW | 201110350 A | 3/2011 |
| TW | 201501299 A | 1/2015 |
| TW | 201727761 A | 8/2017 |

OTHER PUBLICATIONS

Hsieh, et al. "Improved Performance and Reliability for Metal-Oxide Semiconductor Field-Effect-Transistor With Fluorinated Silicate Glass Passivation Layer" Applied Physics Letters 96, 2010, pp. 022905-1-022905-3.

(Continued)

*Primary Examiner* — Vincent Wall
(74) *Attorney, Agent, or Firm* — Slater Matsil, LLP (57) ABSTRACT

Generally, the present disclosure provides example embodiments relating to formation of a gate structure of a device, such as in a replacement gate process, and the device formed thereby. In an example method, a gate dielectric layer is formed over an active area on a substrate. A dummy layer that contains a passivating species (such as fluorine) is formed over the gate dielectric layer. A thermal process is performed to drive the passivating species from the dummy layer into the gate dielectric layer. The dummy layer is removed. A metal gate electrode is formed over the gate dielectric layer. The gate dielectric layer includes the passivating species before the metal gate electrode is formed.

20 Claims, 8 Drawing Sheets

Related U.S. Application Data (60) Provisional application No. 62/564,827, filed on Sep. 28, 2017.

(51) Int. Cl.
| | | |
|---|---|---|
| *H01L 21/285* | (2006.01) | |
| *H01L 29/40* | (2006.01) | |
| *H01L 29/49* | (2006.01) | |
| *H01L 21/3213* | (2006.01) | |
| *H01L 21/02* | (2006.01) | |
| *H01L 29/78* | (2006.01) | |
| *H01L 29/66* | (2006.01) | |

(52) U.S. Cl.
CPC ...... *H01L 21/32134* (2013.01); *H01L 29/401* (2013.01); *H01L 29/4966* (2013.01); *H01L 29/513* (2013.01); H01L 21/28088 (2013.01); H01L 21/28097 (2013.01); H01L 21/28518 (2013.01); H01L 21/28568 (2013.01); H01L 29/66795 (2013.01); H01L 29/785 (2013.01)

(56) References Cited

U.S. PATENT DOCUMENTS

| | | |
|---|---|---|
| 8,319,295 B2 | 11/2012 | Collaert et al. |
| 8,492,230 B2 | 7/2013 | Ishikawa et al. |
| 9,508,556 B1 | 11/2016 | Tsai et al. |
| 2003/0054628 A1 | 3/2003 | Leng et al. |
| 2008/0164539 A1 | 7/2008 | Collaert et al. |
| 2009/0137117 A1 | 5/2009 | Park et al. |
| 2012/0323008 A1 | 12/2012 | Barry et al. |
| 2013/0113053 A1 | 5/2013 | Lin et al. |
| 2013/0270646 A1* | 10/2013 | Kim ............ H01L 29/4966 257/369 |
| 2014/0183666 A1 | 7/2014 | Pramanik |
| 2014/0217483 A1* | 8/2014 | Choi ............ H01L 29/785 257/288 |
| 2015/0132938 A1 | 5/2015 | Ahmed et al. |
| 2016/0225871 A1* | 8/2016 | Cheng ............ H01L 21/823842 |
| 2017/0069737 A1 | 3/2017 | Choi et al. |
| 2017/0170027 A1* | 6/2017 | Hou ............ H01L 21/324 |
| 2017/0186868 A1 | 6/2017 | Cheng et al. |
| 2018/0145149 A1 | 5/2018 | Chiang et al. |
| 2019/0088498 A1 | 3/2019 | Wang et al. |
| 2019/0088763 A1 | 3/2019 | Chiang et al. |

OTHER PUBLICATIONS

Taiwan Office Action dated Jul. 16, 2019 for co-pending Taiwan Patent Application No 107107899, 6 pages.
Google Translation of Taiwan Office Action dated Jul. 16, 2019 for co-pending Taiwan Patent Application No. 107107899, downloaded Aug. 27, 2019, 5 pages.
U.S. Appl. No. 16/005,986, filed Jun. 12, 2018, 45 pages.
Kim et al., "The interaction of metals and barrier layers with Fluorinated silicon oxides," Solid-State Electronics 43 (1999), Jan. 1999, pp. 1019-1023.
Yuan et al., "Atomistic Modeling of Fluorine Implantation and Diffusion in III-Nitride Semiconductors," 2008 IEEE International Electron Devices Meeting, Dec. 2008, 4 pages.

* cited by examiner

GATE STRUCTURE PASSIVATING SPECIES DRIVE-IN METHOD AND STRUCTURE FORMED THEREBY

PRIORITY CLAIM AND CROSS-REFERENCE

This application is a divisional of U.S. application Ser. No. 15/824,474, filed on Nov. 28, 2017, entitled "Gate Structure Passivating Species Drive-In Method and Structure Formed Thereby," which claims the benefit of and priority to U.S. Provisional Patent Application No. 62/564,827, filed on Sep. 28, 2017, entitled "Gate Structure Passivating Species Drive-In Method and Structure Formed Thereby," which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to formation of a gate structure of a device, such as in a replacement gate process, and the device formed thereby. More specifically, in some examples, after a gate dielectric layer is deposited, a dummy layer containing a passivating species, such as fluorine, is formed over the gate dielectric layer, and a thermal process causes the passivating species to diffuse from the dummy layer into the gate dielectric layer thereby passivating (e.g., fluorinating) the gate dielectric layer. The dummy layer is then removed, and subsequent layers of the gate structure are formed, such as one or more work-function tuning layers and a metal gate electrode. Among other benefits, device degradation, such as time-dependent dielectric breakdown (TDDB), and device performance can be improved.

Examples described herein use fluorine as a passivating species. Other examples can implement other passivating species that are capable of passivating a gate dielectric layer, for example. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

Figure 1:
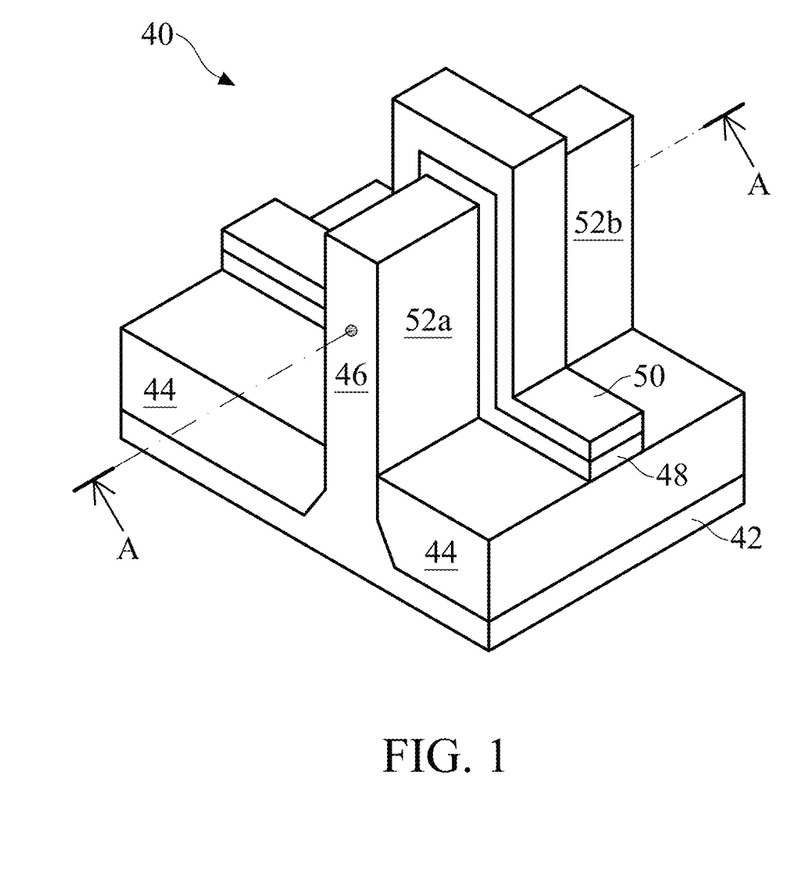
FIG. 1 is a three-dimensional view of an example simplified Fin Field Effect Transistor (FinFET) in accordance with some embodiments.

FIG. 1 illustrates a three-dimensional view of an example of a simplified Fin Field Effect Transistor (FinFET) 40 in accordance with some embodiments. Other aspects not illustrated in or described with respect to FIG. 1 may become apparent from the following figures and description. The FinFET 40 comprises a fin 46 on a substrate 42. The substrate 42 includes isolation regions 44, and the fin 46 protrudes above and from between the neighboring isolation regions 44. Gate dielectric 48 is along sidewalls and over a top surface of the fin 46, and gate electrode 50 is over the gate dielectric 48. Source/drain regions 52a and 52b are disposed in opposing regions of the fin 46 with respect to the gate dielectric 48 and gate electrode 50. FIG. 1 further illustrates a reference cross-section A-A that is used for later figures. Cross-section A-A is in a plane along, e.g., a channel in the fin 46 between the opposing source/drain regions 52a and 52b.

The source/drain regions 52a and 52b may be shared between various transistors, for example. In some examples, the source/drain regions 52a and 52b may be connected or coupled to other FinFETs such that the FinFETs are implemented as one functional transistor. For example, if neighboring (e.g., as opposed to opposing) source/drain regions are electrically connected, such as through coalescing the regions by epitaxial growth, one functional transistor may be implemented. Other configurations in other examples may implement other numbers of functional transistors.

Figure 2:
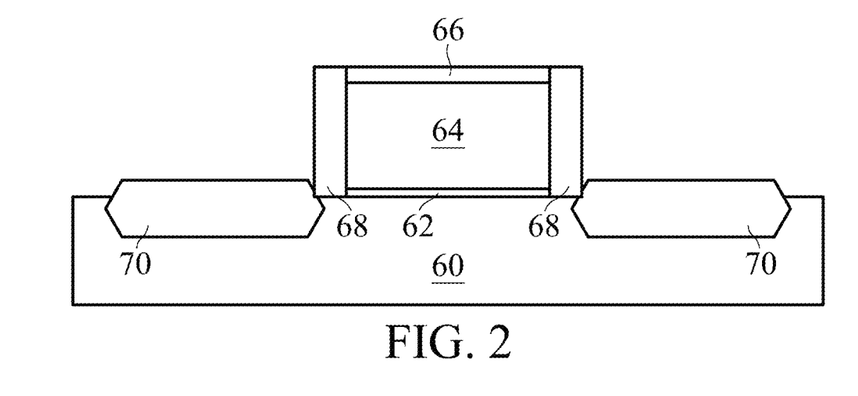
FIGS. 2 through 10 are cross-sectional views of respective intermediate structures during an example method for forming a semiconductor device in accordance with some embodiments.

FIGS. 2 through 10 illustrate cross-sectional views (e.g., along cross-section A-A) of respective intermediate structures during an example method for forming a semiconductor device in accordance with some embodiments. The semiconductor device can be a Field Effect Transistor (FET), which may be a FinFET like shown in FIG. 1, a planar FET, a Horizontal Gate All Around (HGAA) FET, or another device. FIG. 2 illustrates a semiconductor substrate 60 with at least a portion of the semiconductor device formed thereon. The semiconductor substrate 60 may be or include a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on or is a substrate, typically a silicon or glass substrate. Other substrates, such as a multi-layered or gradient substrate may also be used. In some embodiments, the semiconductor material of the semiconductor substrate may include an elemental semiconductor such as silicon (Si) and/or germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof.

As previously stated, the device can be a planar FET, a FinFET like in FIG. 1, a HGAA FET, or another device. In accordance with a FET, a dummy gate stack, and more generically, a gate structure, is formed on an active area of the semiconductor substrate 60. In a planar FET, the active area can be or include a portion at the top surface of the semiconductor substrate 60 delineated by isolation regions. In a FinFET, the active area can be or include a fin protruding from between isolation regions on the semiconductor substrate 60, like shown in FIG. 1. A person having ordinary skill in the art will readily understand that a gate stack can be formed along sidewalls and a top surface of a fin, such as illustrated in FIG. 1. Further, a person having ordinary skill in the art will readily understand how gate stacks can be formed on active areas for other types of FETs.

The dummy gate stack comprises an interfacial dielectric 62 over the active area, a gate layer 64 over the interfacial dielectric 62, and a mask layer 66 over the gate layer 64. The interfacial dielectric 62, gate layer 64, and mask layer 66 for the dummy gate stack may be formed by sequentially forming or depositing the respective layers, and then patterning those layers into the dummy gate stack. For example, the interfacial dielectric 62 may include or be silicon oxide, silicon nitride, the like, or multilayers thereof; the gate layer 64 may include or be silicon (e.g., polysilicon) or another material; and the mask layer 66 may include or be silicon nitride, silicon oxynitride, silicon carbon nitride, the like, or a combination thereof. Processes for forming or depositing the interfacial dielectric 62, gate layer 64, and mask layer 66 include thermal and/or chemical growth, Chemical Vapor Deposition (CVD), Plasma-Enhanced CVD (PECVD), Molecular-Beam Deposition (MBD), Atomic Layer Deposition (ALD), Physical Vapor Deposition (PVD), and other deposition techniques.

The layers for the interfacial dielectric 62, gate layer 64, and mask layer 66 may then be patterned to be the dummy gate stack, for example, using photolithography and one or more etch processes. For example, a photo resist can be formed on the mask layer 66, such as by using spin-on coating, and can be patterned by exposing the photo resist to light using an appropriate photomask. Exposed or unexposed portions of the photo resist may then be removed depending on whether a positive or negative resist is used. The pattern of the photo resist may then be transferred to the layers of the mask layer 66, gate layer 64, and interfacial dielectric 62, such as by using one or more suitable etch processes. The one or more etch processes may include a reactive ion etch (RIE), neutral beam etch (NBE), the like, or a combination thereof. The etch process may be anisotropic. Subsequently, the photo resist is removed in an ashing or wet strip processes, for example.

In some embodiments, after forming the dummy gate stack, lightly doped drain (LDD) regions (not specifically illustrated) may be formed in the active area. For example, dopants may be implanted into the active area using the dummy gate stack as a mask. Example dopants can include or be, for example, boron for a p-type device and phosphorus or arsenic for an n-type device, although other dopants may be used. The LDD regions may have a dopant concentration in a range from about $10^{15}$ cm$^{-3}$ to about $10^{17}$ cm$^{-3}$.

Gate spacers 68 are formed along sidewalls of the dummy gate stack (e.g., sidewalls of the interfacial dielectric 62, gate layer 64, and mask layer 66) and over the active area on the semiconductor substrate 60. The gate spacers 68 may be formed by conformally depositing one or more layers for the gate spacers 68 and anisotropically etching the one or more layers, for example. The one or more layers for the gate spacers 68 may include or be silicon nitride, silicon oxynitride, silicon carbon nitride, the like, multi-layers thereof, or a combination thereof, deposited by CVD, ALD, or another deposition technique. The etch process can include a RIE, NBE, or another etch process.

Source/drain regions 70 are formed in the active regions on opposing sides of the dummy gate stack. In some examples, the source/drain regions 70 are formed by implanting dopants into the active areas using the dummy gate stack and gate spacers 68 as a mask. Hence, source/drain regions 70 can be formed by implantation on opposing sides of the dummy gate stack.

In other examples, such as illustrated, the active areas may be recessed using the dummy gate stack and gate spacers 68 as a mask, and source/drain regions 70 may be epitaxially grown in the recesses. The recessing can be performed by an etch process. The etch process can be isotropic or anisotropic, or further, may be selective with respect to one or more crystalline planes of the semiconductor substrate 60. Hence, the recesses can have various cross-sectional profiles based on the etch process implemented. The etch process may be a dry etch, such as a RIE, NBE, or the like, or a wet etch, such as using tetramethylammonium hydroxide (TMAH), ammonium hydroxide (NH$_4$OH), or another etchant. The source/drain regions 70 may include or be silicon germanium (Si$_x$Ge1-x, where x can be between approximately 0 and 100), silicon carbide, silicon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The source/drain regions 70 may be formed in the recesses by epitaxially growing a material in the recesses, such as by metal-organic CVD (MOCVD), molecular beam epitaxy (MBE), liquid phase epitaxy (LPE), vapor phase epitaxy (VPE), selective epitaxial growth (SEG), the like, or a combination thereof. Source/drain regions 70 may be raised in relation to the active area, as illustrated. The source/drain regions 70 may be doped by in situ doping during the epitaxial growth and/or by implantation after the epitaxial growth. Hence, source/drain regions 70 can be formed by epitaxial growth, and possibly with implantation, on opposing sides of the dummy gate stack.

Example dopants for source/drain regions 70 (e.g., by in situ doping or implantation) can include or be, for example, boron for a p-type device and phosphorus or arsenic for an n-type device, although other dopants may be used. The source/drain regions 70 may have a dopant concentration in a range from about $10^{19}$ cm$^{-3}$ to about $10^{21}$ cm$^{-3}$.

Figure 3:
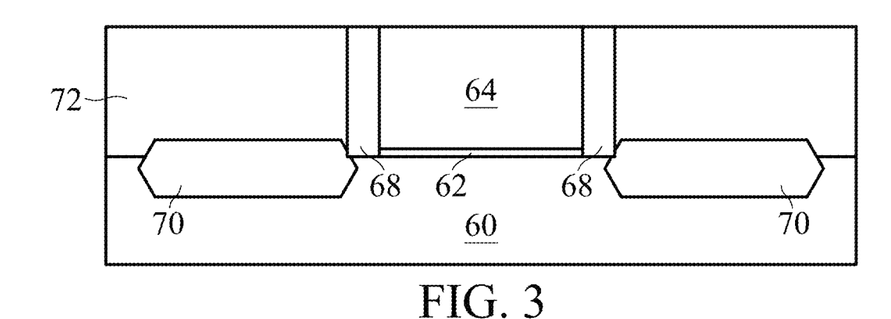

FIG. 3 illustrates the formation of a first interlayer dielectric (ILD) 72 over the active area of the semiconductor substrate 60 and along the gate spacers 68. The first ILD 72 may include an etch stop layer (ESL) and a principal dielectric layer such as a low-k dielectric layer, for example. Generally, an etch stop layer can provide a mechanism to stop an etch process when forming, e.g., contacts or vias. An etch stop layer may be formed of a dielectric material having a different etch selectivity from adjacent layers, for example, the principal dielectric layer of the ILD.

The first ILD 72 is deposited over the active area, dummy gate stack, and gate spacers 68. For example, the etch stop layer may be conformally deposited over the active area, dummy gate stack, and gate spacers 68. The etch stop layer may comprise or be silicon nitride, silicon carbon nitride, silicon carbon oxide, carbon nitride, the like, or a combination thereof, and may be deposited by CVD, PECVD, ALD, or another deposition technique. Then, for example, the principal dielectric layer is deposited over the etch stop layer. The principal dielectric layer may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiO$_x$C$_y$, Spin-On-Glass, Spin-On-Polymers, silicon carbon material, a compound thereof, a composite thereof, the like, or a combination thereof. The principal dielectric layer may be deposited by spin-on, CVD, Flowable CVD (FCVD), PECVD, PVD, or another deposition technique.

The first ILD 72 can be planarized after being deposited. A planarization process, such as a Chemical Mechanical Polish (CMP), may be performed to planarize the first ILD 72. The top surface of the first ILD 72 is planarized to be coplanar with the top surface of the dummy gate stack to thereby expose the dummy gate stack through the first ILD 72. The planarization may remove the mask layer 66 of the dummy gate stack (and, in some instances, upper portions of the gate spacers 68), and accordingly, the top surface of the gate layer 64 of the dummy gate stack is exposed through the first ILD 72.

Figure 4:
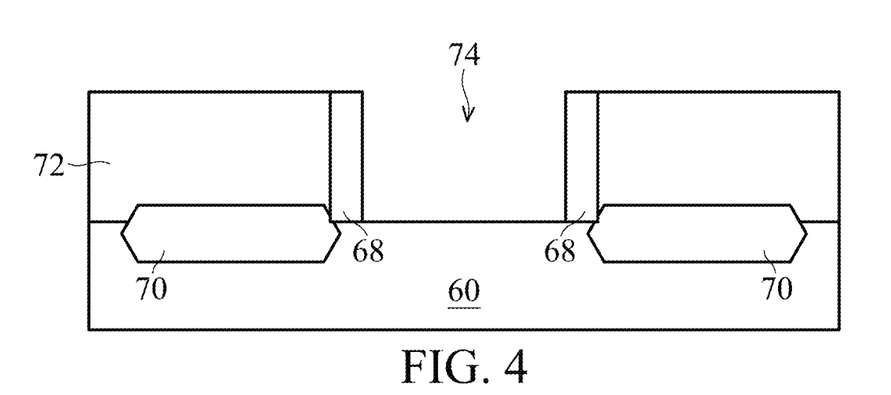

FIG. 4 illustrates the removal of the dummy gate stack, which forms a recess 74 between the gate spacers 68. Once exposed through the first ILD 72, the gate layer 64 and interfacial dielectric 62 of the dummy gate stack are removed, such as by one or more etch processes. The gate layer 64 may be removed by an etch process selective to the gate layer 64, wherein the interfacial dielectric 62 can act as an etch stop layer, and subsequently, the interfacial dielectric 62 can be removed by a different etch process selective to the interfacial dielectric 62. The etch processes can be, for example, a RIE, NBE, a wet etch, or another etch process.

Figure 5:
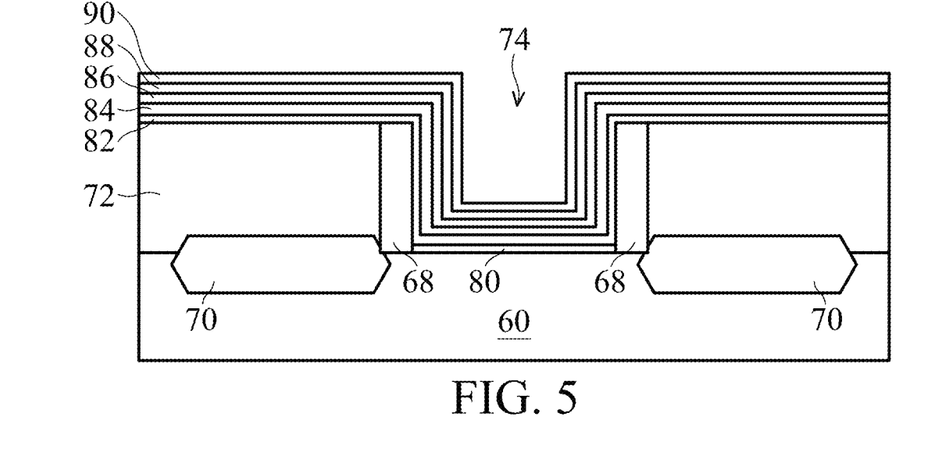

FIG. 5 illustrates the formation of, among others, a gate dielectric layer 82 and a dummy fluorine-containing layer 88. Examples described herein use fluorine as a passivating species, and hence, the dummy layer 88 contains fluorine. In other example embodiments, another passivating species may be used instead of, or in addition to, fluorine. Description with respect to fluorine herein may be more broadly and generally applied to any appropriate passivating species.

In some examples, such as illustrated, an interfacial dielectric 80 is formed on the active area of the semiconductor substrate 60 exposed through the recess 74 and between the gate spacers 68. The interfacial dielectric 80 can be, for example, an oxide formed by thermal or chemical oxidation. In some examples, the interfacial dielectric 62 of the dummy gate stack can remain and be in the place of the interfacial dielectric 80. In further examples, the interfacial dielectric 80 may result from various processing steps, such as being a native oxide formed as a result of a cleaning process. In other examples, the interfacial dielectric 80 may be omitted.

The gate dielectric layer 82 is conformally deposited in the recess 74. For example, the gate dielectric layer 82 is deposited over the interfacial dielectric 80, along sidewalls of the gate spacers 68, and over top surfaces of the gate spacers 68 and first ILD 72. The gate dielectric layer 82 can be or include silicon oxide, silicon nitride, a high-k dielectric material, multilayers thereof, or other dielectric material. A high-k dielectric material may have a k value greater than about 7.0, and may include a metal oxide of or a metal silicate of Hf, Al, Zr, La, Mg, Ba, Ti, Pb, or a combination thereof. The gate dielectric layer 82 can be deposited by ALD, PECVD, MBD, or another deposition technique. The gate dielectric layer 82 can have a thickness in a range from about 5 Å to about 25 Å.

A capping layer 84 is conformally deposited on the gate dielectric layer 82. The capping layer 84 may include or be titanium nitride, titanium-silicon nitride, titanium-carbon nitride, titanium-aluminum nitride, tantalum nitride, tantalum-silicon nitride, tantalum-carbon nitride, aluminum nitride, the like, or a combination thereof, and may be deposited by ALD, PECVD, MBD, or another deposition technique. The capping layer 84 can have a thickness in a range from about 5 Å to about 30 Å. A barrier layer 86 is conformally deposited on the capping layer 84. The barrier layer 86 may include or be tantalum nitride, tantalum-silicon nitride, tantalum-carbon nitride, tantalum-aluminum nitride, titanium nitride, titanium-silicon nitride, titanium-carbon nitride, titanium-aluminum nitride, aluminum nitride, the like, or a combination thereof, and may be deposited by ALD, PECVD, MBD, or another deposition technique. The barrier layer 86 can have a thickness in a range from about 5 Å to about 30 Å.

The dummy fluorine-containing layer 88 is conformally deposited on the barrier layer 86. The dummy fluorine-containing layer 88 comprises a concentration of fluorine, such as in a range from greater than 0 percent of the dummy fluorine-containing layer 88 to about 1 percent of the dummy fluorine-containing layer 88. The dummy fluorine-containing layer 88 may include or be fluorine-doped tungsten, fluorine-doped tungsten silicide, fluorine-doped tungsten nitride, fluorine-doped tungsten carbide, fluorine-doped titanium nitride, fluorine-doped tantalum nitride, fluorine-doped silicon, fluorine-doped silicon oxide, the like, or a combination thereof, and may be deposited by ALD, PECVD, MBD, or another deposition technique. The dummy fluorine-containing layer 88 can have a thickness in a range from about 5 Å to about 50 Å. In a specific example, the dummy fluorine-containing layer 88 is fluorine-doped tungsten deposited by ALD. In that example, the ALD process may use a tungsten fluoride (e.g., $WF_6$) precursor and another appropriate precursor, such as diborane ($B_2H_6$), ethane ($C_2H_6$), or silane ($SiH_4$). The ALD process can include cycles of the tungsten fluoride flow, followed by a purge, followed by the other precursor flow, and followed by a purge.

A dummy capping layer 90 is conformally deposited on the dummy fluorine-containing layer 88. The dummy capping layer 90 may include or be titanium nitride, titanium-silicon nitride, titanium-carbon nitride, titanium-aluminum nitride, tantalum nitride, tantalum-silicon nitride, tantalum-carbon nitride, tungsten nitride, tungsten carbide, tungsten-carbon nitride, aluminum nitride, the like, or a combination thereof, and may be deposited by ALD, PECVD, MBD, or another deposition technique. The dummy capping layer 90 can have a thickness in a range from about 5 Å to about 30 Å.

An amount of fluorine available to diffuse from the dummy fluorine-containing layer 88 into the gate dielectric layer 82 may be affected by the thickness of the dummy fluorine-containing layer 88, which in turn can determine a volume of the dummy fluorine-containing layer 88, and the concentration of fluorine in the dummy fluorine-containing layer 88. A higher amount of fluorine available for diffusion can increase an amount of fluorine that diffuses into the gate dielectric layer 82.

One or more thermal processes are performed to facilitate diffusion of fluorine, or to drive fluorine, from the dummy fluorine-containing layer 88 into the gate dielectric layer 82. Example thermal processes can be at a temperature in a range from about 300° C. to about 600° C. for a duration in a range from about 15 seconds to about 180 seconds. For example, the deposition of the dummy fluorine-containing layer 88 can be at an elevated temperature, such as at a temperature of 300° C. for a duration of 97 seconds. Additionally, the deposition of the dummy capping layer 90 can also be at an elevated temperature, such as at a temperature of 450° C. for a duration of 175 seconds. The deposition of each of the dummy fluorine-containing layer 88 and the dummy capping layer 90 at an elevated temperature can facilitate fluorine diffusing from the dummy fluorine-containing layer 88 into the gate dielectric layer 82. Further, an additional thermal process, such as an anneal can be performed. The anneal can be a Rapid Thermal Anneal (RTA), furnace anneal, or another thermal process. In an example, an RTA at 575° C. for 15 seconds is implemented. More generally, the duration and temperature(s) at which the dummy fluorine-containing layer 88 is in the intermediate structure can affect how much fluorine diffuses into the gate dielectric layer 82.

Figure 6:
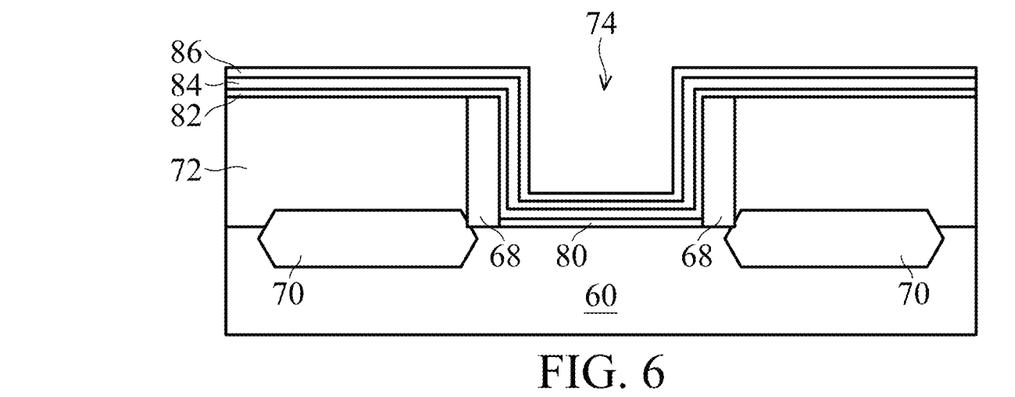

FIG. 6 illustrates the removal of the dummy capping layer 90 and dummy fluorine-containing layer 88 after the thermal process. The dummy capping layer 90 and dummy fluorine-containing layer 88 are removed, such as by one or more etch processes and cleaning process. The dummy capping layer 90 dummy fluorine-containing layer 88 may be removed by an etch process selective to the materials of the dummy capping layer 90 and dummy fluorine-containing layer 88, respectively. The one or more etch processes can be, for example, an isotropic etch process, such as a wet etch like using phosphoric acid ($H_3PO_4$), or another etch process. In some examples, a residue of the etch process may remain after the etch process. For example, assuming that the dummy fluorine-containing layer 88 is fluorine-doped tungsten, residual tungsten may remain on the surface of the barrier layer 86, which may remain and be detectable in a completed gate structure.

Figure 7:
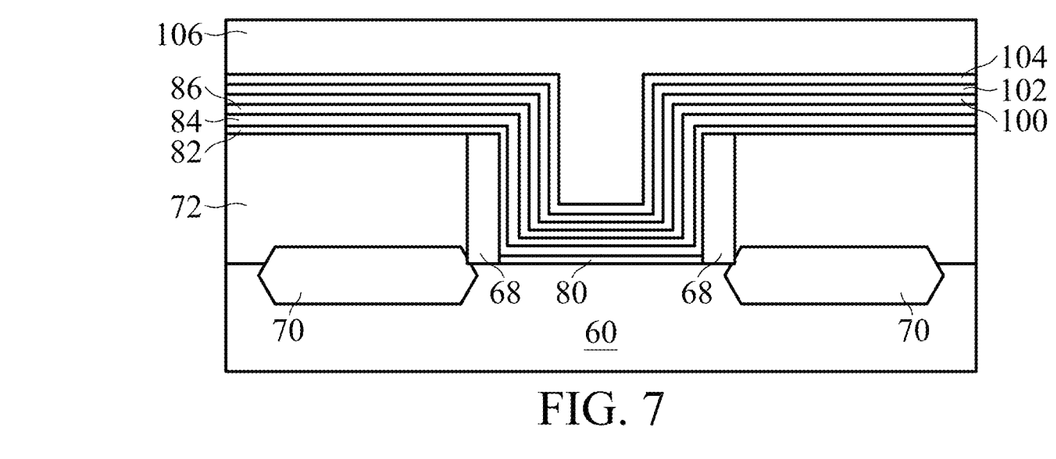

FIG. 7 illustrates the formation of a first work-function tuning layer 100, a second work-function tuning layer 102, a barrier/adhesion layer 104, and a metal gate electrode 106. The first work-function tuning layer 100 is conformally deposited on the barrier layer 86. The first work-function tuning layer 100 may include or be titanium nitride (TiN), titanium-silicon nitride, titanium-carbon nitride, titanium-aluminum nitride, tantalum nitride, tantalum-silicon nitride ($TaSi_xN_y$), tantalum-carbon nitride, tungsten nitride, tungsten carbide, tungsten-carbon nitride, cobalt, platinum, the like, or a combination thereof, and may be deposited by ALD, PECVD, MBD, or another deposition technique. The first work-function tuning layer 100 can have a thickness in a range from about 5 Å to about 60 Å. The second work-function tuning layer 102 is conformally deposited on the first work-function tuning layer 100. The second work-function tuning layer 102 may include or be titanium aluminum carbide (TiAlC), a titanium aluminum alloy, tantalum-aluminum carbide, the like, or a combination thereof, and may be deposited by ALD, PECVD, MBD, or another deposition technique. The second work-function tuning layer 102 can have a thickness in a range from about 10 Å to about 60 Å. Other examples can have various other configurations of work-function tuning layers to achieve a desired performance of the device to be formed. For example, any different number of work-function layers having various materials and/or thicknesses may be used. In some instances, for example, a p-type FET and an n-type FET may have different work-function tuning layer(s).

The barrier/adhesion layer 104 is conformally deposited on the second work-function tuning layer 102. The barrier/adhesion layer 104 may include or be titanium nitride, titanium-silicon nitride, titanium-carbon nitride, titanium-aluminum nitride, tantalum nitride, tantalum-silicon nitride, tantalum-carbon nitride, tungsten nitride, tungsten carbide, tungsten-carbon nitride, the like, or a combination thereof, and may be deposited by ALD, PECVD, MBD, or another deposition technique. The barrier/adhesion layer 104 can have a thickness in a range from about 10 Å to about 50 Å. The metal gate electrode 106 is deposited on the barrier/adhesion layer 104. The metal gate electrode 106 can fill remaining recess 74 where the dummy gate stack was removed. The metal gate electrode 106 may be or comprise a metal-containing material such as tungsten, cobalt, ruthenium, aluminum, copper, multi-layers thereof, or a combination thereof. The metal gate electrode 106 can be deposited by ALD, PECVD, MBD, PVD, or another deposition technique.

Figure 8:
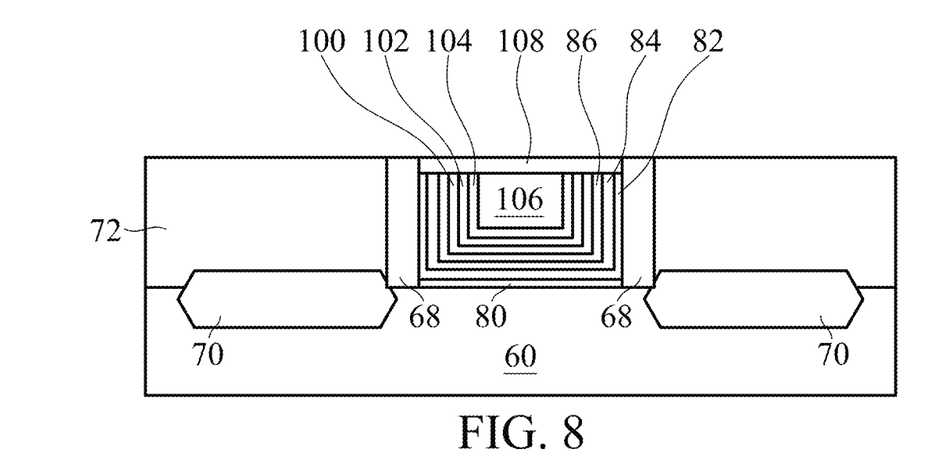

FIG. 8 illustrates the removal of excess portions of the metal gate electrode 106, barrier/adhesion layer 104, second work-function tuning layer 102, first work-function tuning layer 100, barrier layer 86, capping layer 84, and gate dielectric layer 82 above the top surfaces of the first ILD 72 and gate spacers 68. For example, a planarization process, like a CMP, may remove the portions of the metal gate electrode 106, barrier/adhesion layer 104, second work-function tuning layer 102, first work-function tuning layer 100, barrier layer 86, capping layer 84, and gate dielectric layer 82 above the top surfaces of the first ILD 72 and gate spacers 68.

Further, the metal gate electrode 106, barrier/adhesion layer 104, second work-function tuning layer 102, first work-function tuning layer 100, barrier layer 86, capping layer 84, and gate dielectric layer 82 are recessed below the top surfaces of the first ILD 72 and gate spacers 68, and a gate cap 108 is formed in the recess. An etch-back may recess top surfaces of the metal gate electrode 106, barrier/adhesion layer 104, second work-function tuning layer 102, first work-function tuning layer 100, barrier layer 86, capping layer 84, and gate dielectric layer 82 to a level below the top surfaces of the first ILD 72 and gate spacers 68. The etch-back may be a RIE, wet etch, or another etch process, for example.

A layer for the gate cap 108 is formed over the metal gate electrode 106, barrier/adhesion layer 104, second work-function tuning layer 102, first work-function tuning layer 100, barrier layer 86, capping layer 84, and gate dielectric layer 82 (e.g., where the metal gate electrode 106, barrier/adhesion layer 104, second work-function tuning layer 102, first work-function tuning layer 100, barrier layer 86, capping layer 84, and gate dielectric layer 82 have been etched back) and over the first ILD 72 and gate spacers 68. The layer for the gate cap 108 may include or be silicon oxynitride, silicon nitride, silicon carbide, silicon carbon nitride, the like, or a combination thereof, and may be deposited by CVD, PVD, ALD, or another deposition technique. Portions of the layer for the gate cap 108 above the top surfaces of the first ILD 72 and gate spacers 68 are removed. For example, a planarization process, like a CMP, may remove the portions of the layer for gate cap 108 above the top surfaces of the first ILD 72 and gate spacers 68, and the top surface of the gate cap 108 may be formed coplanar with the top surfaces of the first ILD 72 and gate spacers 68. A replacement gate structure comprising the metal gate electrode 106, barrier/adhesion layer 104, second work-function tuning layer 102, first work-function tuning layer 100, barrier layer 86, capping layer 84, and gate dielectric layer 82 may therefore be formed.

Figure 9:
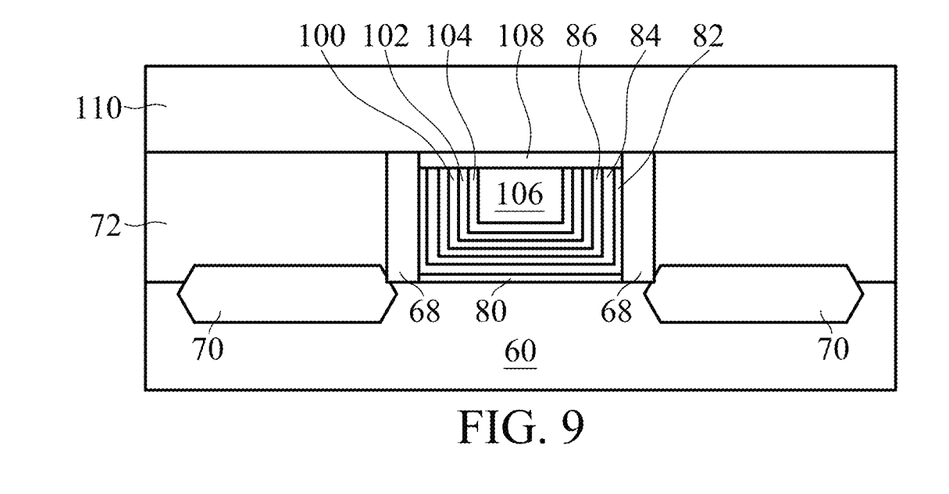

FIG. 9 illustrates the formation of a second ILD 110. The second ILD 110 is deposited over the first ILD 72, gate spacers 68, and gate cap 108. The second ILD 110 may include an etch stop layer (ESL) and a principal dielectric layer such as a low-k dielectric layer, for example. For example, the etch stop layer may be deposited over the first ILD 72, gate spacers 68, and gate cap 108. Then, for example, the principal dielectric layer is deposited over the etch stop layer. The etch stop layer and principal dielectric layer of the second ILD 110 can be or include the same or similar materials, and can be deposited using the same or similar techniques, as described above with respect to the etch stop layer and principal dielectric layer of the first ILD 72, respectively. The second ILD 110 can be planarized, such as by a CMP, after being deposited.

Figure 10:
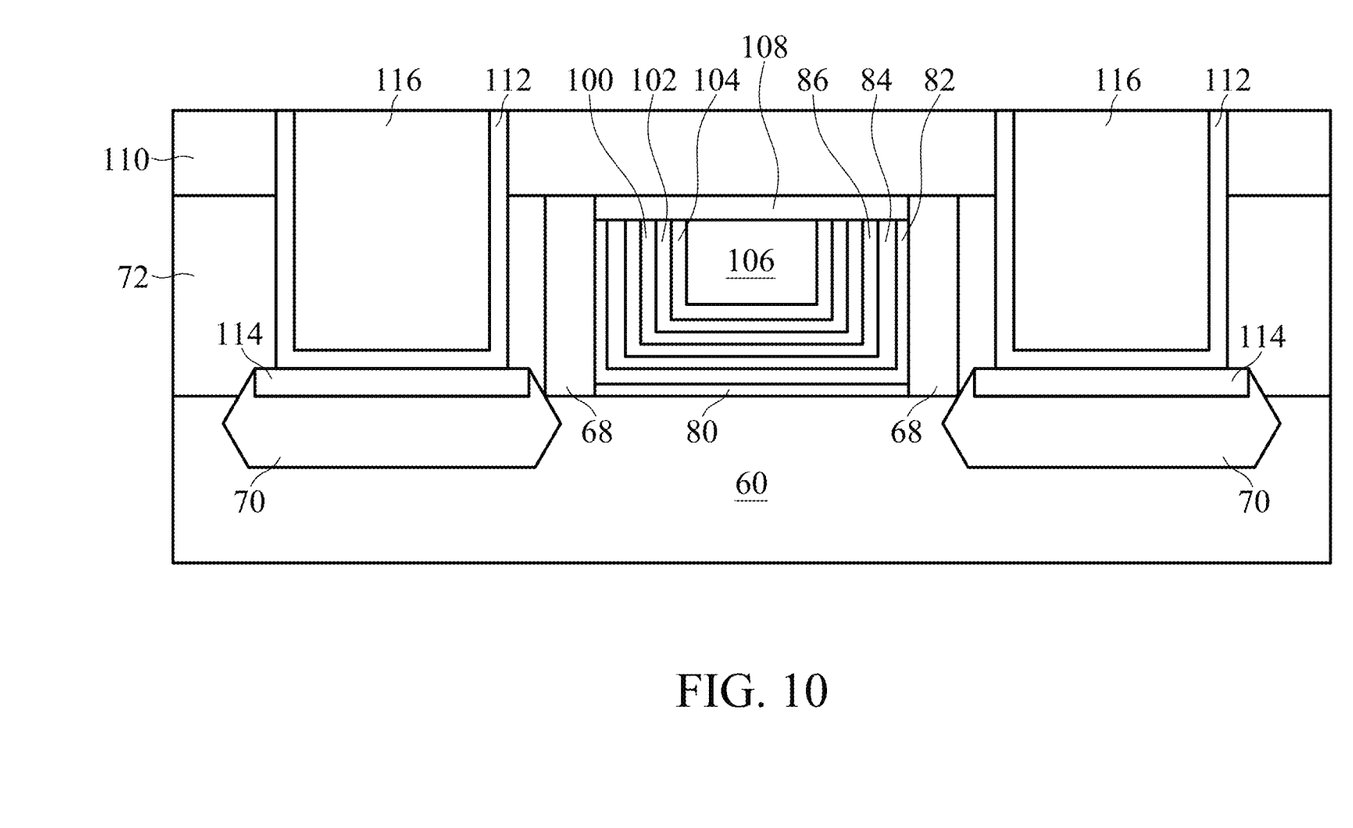

FIG. 10 illustrates the formation of conductive features through the second ILD 110 and first ILD 72 to the source/drain regions 70. Openings are formed through the second ILD 110 and the first ILD 72. Each of the openings exposes a respective source/drain region 70. The openings may be formed using, for example, appropriate photolithography and etch processes. A liner 112 is formed in the openings. The liner 112 can be conformally deposited along sidewalls of the openings and top surfaces of the source/drain regions 70. The liner 112 may be a diffusion barrier layer, an adhesion layer, or the like. The liner 112 may include or be titanium, titanium nitride, tantalum, tantalum nitride, or the like, and may be deposited by ALD, PECVD, MBD, PVD, or another deposition technique. An anneal process may be performed to facilitate a reaction between at least respective portions of the liner 112 and the source/drain regions 70 form silicide regions 114 at the respective source/drain regions 70. A conductive material 116 is formed on the liner 112 in the openings. The conductive material 116 may be or include a metal, such as cobalt, tungsten, copper, aluminum, gold, silver, alloys thereof, the like, or a combination thereof, and may be deposited by CVD, ALD, PVD, or another deposition technique. A planarization process, such as a CMP, may be performed to remove excess conductive material 116 and liner 112 from the top surface of the second ILD 110. The remaining liner 112, silicide regions 114, and conductive material 116 form the conductive features to the respective source/drain regions 70.

After forming the replacement gate structure, such as in FIG. 8 and subsequent processing, the gate dielectric layer 82 comprises fluorine and is fluorinated. The fluorine passivates the gate dielectric layer 82. In other examples, the gate dielectric layer 82 is passivated by another passivating species. A concentration of fluorine in the gate dielectric layer 82 can be greater than 0.5 percent of the gate dielectric layer 82, such as in a range from about 0.5 percent to about 9 percent. The concentration of the fluorine may be a gradient. For example, portions of the gate dielectric layer 82 inward to the replacement gate structure (e.g., distal from the respective gate spacers 68 on which vertical portions of the gate dielectric layer 82 are disposed, and distal from the semiconductor substrate 60 on which a horizontal portion of the gate dielectric layer 82 is disposed) may have a greatest concentration in the gate dielectric layer 82, and the concentration of fluorine decreases as the gate dielectric layer 82 is traversed away from the portions having the greatest concentration (e.g., traversed in an outwardly direction of the replacement gate structure). Such a gradient of the concentration of the fluorine may result from diffusion caused by the thermal process(es) described above with respect to FIG. 5.

The concentration and gradient of the fluorine in the gate dielectric layer 82 can be controlled by the precursor used to deposit the dummy fluorine-containing layer 88 (and therefore, a concentration of fluorine in the dummy fluorine-containing layer 88); the thickness(es) of the dummy fluorine-containing layer 88, capping layer 84, and/or barrier layer 86; the diffusion coefficients of the capping layer 84 and barrier layer 86; the duration that the dummy fluorine-containing layer 88 is contained in the structure; and/or the thermal process conditions used to drive the fluorine into the gate dielectric layer 82. Using various precursors to deposit the dummy fluorine-containing layer 88 can increase or decrease the concentration of fluorine available to diffuse into the gate dielectric layer 82, and therefore, can increase or decrease the amount of fluorine that diffuses into the gate dielectric layer 82. Similarly, varying the thickness of the dummy fluorine-containing layer 88 can increase or decrease the concentration of fluorine available to diffuse into the gate dielectric layer 82, and therefore, can increase or decrease the amount of fluorine that diffuses into the gate dielectric layer 82. For example, assuming a fluorine-doped tungsten material as the dummy fluorine-containing layer 88, the inventors discovered that the amount of fluorine diffused into the gate dielectric layer 82 increased significantly for dummy fluorine-containing layers deposited using ALD using up to seven cycles, but the amount of fluorine that diffused generally plateaued after seven cycles. Increasing or decreasing the thickness of one or both of the capping layer 84 and barrier layer 86 can increase or decrease the ability of fluorine to diffuse through the capping layer 84 and barrier layer 86, and can therefore increase or decrease the amount of fluorine that diffuses into the gate dielectric layer 82.

Figure 11:
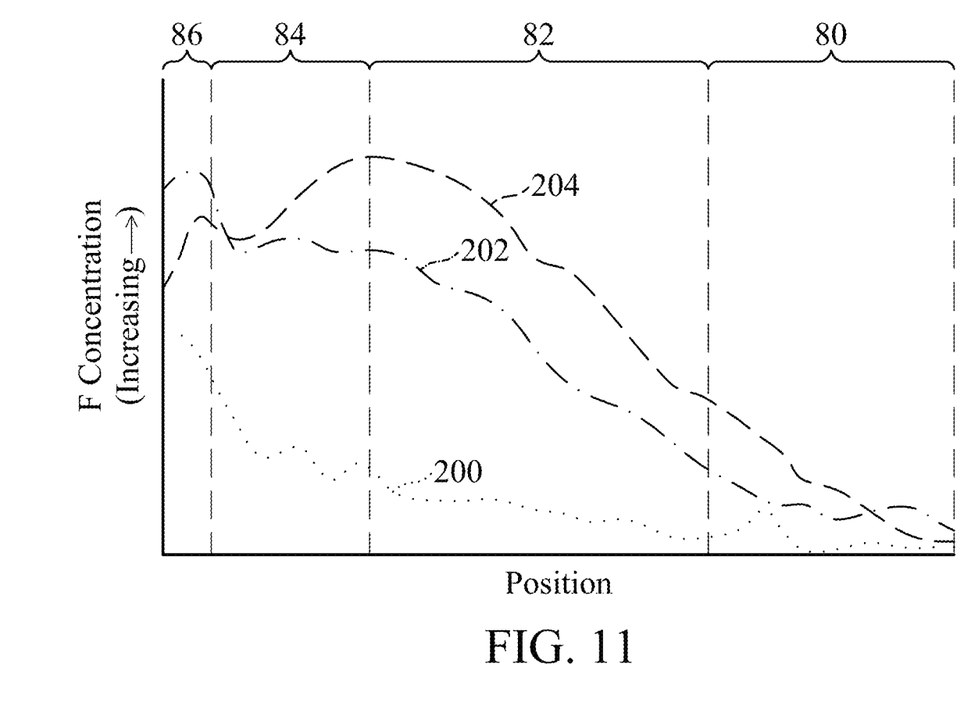
FIG. 11 is example profiles of fluorine for different thermal processes in accordance with some embodiments.

Further, the thermal process conditions, such as temperature, duration, and process or tool type, can affect diffusion of fluorine into the gate dielectric layer. For example, a higher temperature process and/or a longer duration can increase the amount of fluorine that diffuses into the gate dielectric layer 82. FIG. 11 illustrates example profiles of fluorine after different process stages in accordance with some embodiments. The profiles are shown across the barrier layer 86, the capping layer 84, the gate dielectric layer 82, and the interfacial dielectric 80. A first profile 200 is after depositing the dummy fluorine-containing layer 88 at a temperature of 300° C. for a duration of 97 seconds, such as described with respect to FIG. 5. A second profile 202 is after depositing the dummy capping layer 90 at a temperature of 450° C. for a duration of 175 seconds, such as described with respect to FIG. 5. A third profile 204 is after an RTA at a temperature of 575° C. for a duration of 15 seconds, such as described with respect to FIG. 5. These profiles 200, 202, and 204 further illustrate respective gradients that can occur in the gate dielectric layer 82 as previously described.

Figure 12:
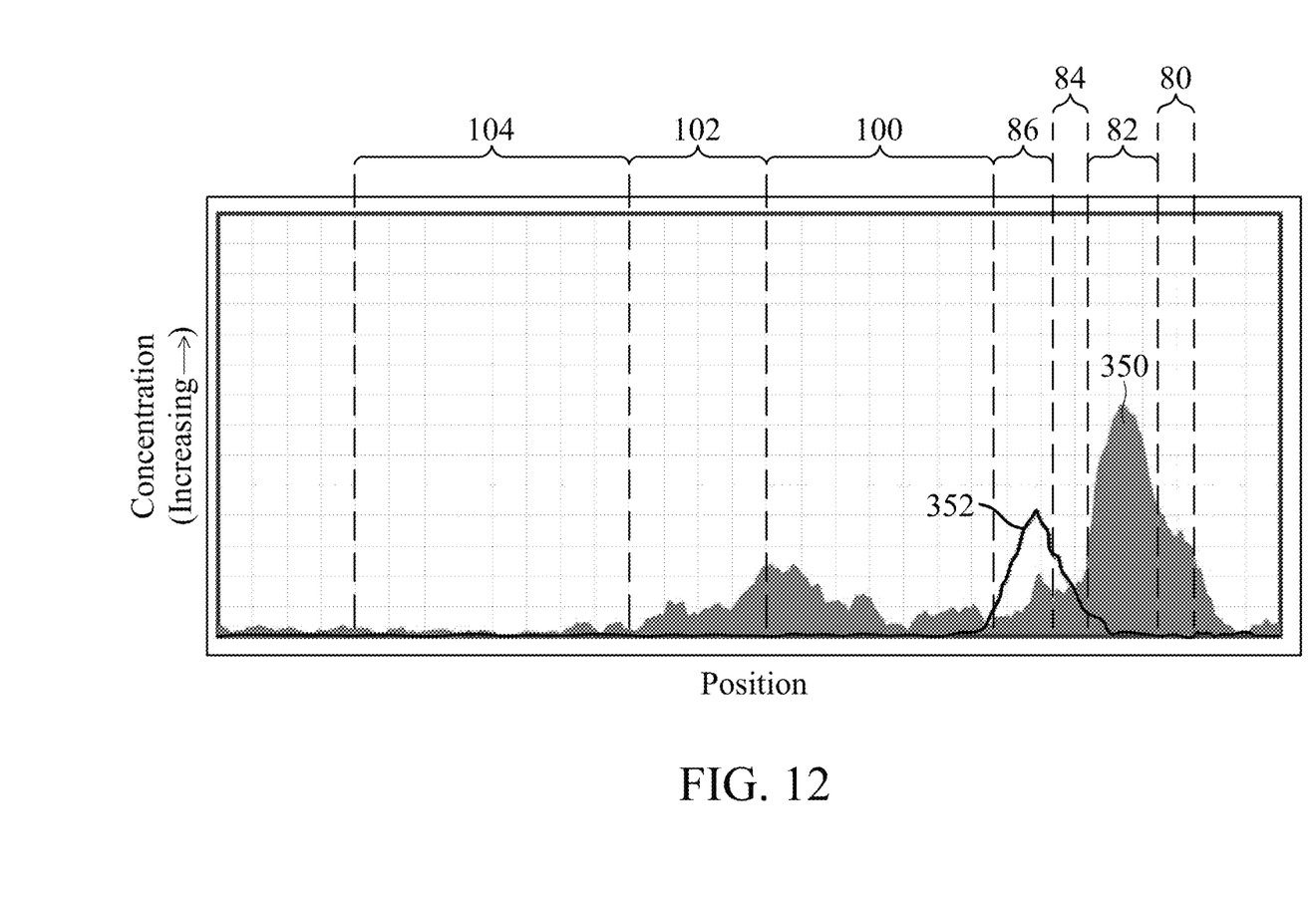
FIG. 12 is example profiles of fluorine and tungsten across multiple layers in accordance with some embodiments.

Further, the metal gate electrode 106, barrier/adhesion layer 104, second work-function tuning layer 102, and first work-function tuning layer 100 may be substantially free of fluorine. For example, the metal gate electrode 106, barrier/adhesion layer 104, second work-function tuning layer 102, and first work-function tuning layer 100 may, in some instances, not contain a traceable amount of fluorine and/or may have an insubstantial amount of fluorine resulting, e.g., from natural diffusion or occurrence of fluorine independent of any processing, such as may occur in the absence of processing to intentionally form fluorine in those layers. For example, the metal gate electrode 106, barrier/adhesion layer 104, second work-function tuning layer 102, and first work-function tuning layer 100 may be formed using a precursor that contains fluorine or another process may use fluorine, such as an etch process, that causes insubstantial, residual fluorine to remain in those layers. FIG. 12 illustrates an example profile of fluorine 350 to illustrate an example of insubstantial amounts of fluorine that may occur in the barrier/adhesion layer 104, second work-function tuning layer 102, and first work-function tuning layer 100. Further, FIG. 12 illustrates an example profile of residual tungsten 352 that remains after a fluorine-doped tungsten layer implemented as the dummy fluorine-containing layer 88 is removed, as previously described.

Some embodiments can achieve advantages. In the absence of fluorine or other passivating species in the gate dielectric layer, oxygen vacancies and/or dangling bonds can occur in the gate dielectric layer and/or at a surface of the channel in the semiconductor substrate. Fluorinating the gate dielectric layer, as described above, can passivate the gate dielectric layer by filling the oxygen vacancies and attaching to the dangling bonds. By fluorinating the gate dielectric layer, charge trapping and interfacial charge scattering can be reduced. By diffusing fluorine from a dummy fluorine-containing layer into the gate dielectric layer, as described above, the gate dielectric layer may be doped with fluorine more conformally and with better coverage, which may be particularly advantageous for smaller technology nodes, such as 7 nm and smaller, and more particularly in three-dimensional (3D) technology such as FinFETs. The improved conformality of the fluorination may permit reduced time-dependent dielectric breakdown (TDDB) degradation and permit greater reliability. Further, in some embodiments, no plasma and no implantation is required to fluorinate the gate dielectric layer, which can prevent lattice damage and performance degradation. Even further, since some work-function tuning layers may be formed after fluorinating the gate dielectric layer, the work-function of the transistor may be more easily tuned since significant amounts of fluorine are not in those layers to significantly impact the layers, and hence, performance of the transistor can be increased, such as an improved threshold voltage.

An embodiment is a method. A gate dielectric layer is formed over an active area on a substrate. A dummy fluorine-containing layer is formed over the gate dielectric layer. A thermal process is performed to drive fluorine from the dummy fluorine-containing layer into the gate dielectric layer. The dummy fluorine-containing layer is removed. A metal gate electrode is formed over the gate dielectric layer. The gate dielectric layer includes fluorine before the metal gate electrode is formed.

Another embodiment is a method. A gate dielectric layer is conformally formed between gate spacers that are over a fin on a substrate. The gate dielectric layer is conformally formed along sidewalls and a top surface of the fin and along respective sidewalls of the gate spacers. A dummy layer is conformally formed over the gate dielectric layer. The dummy layer includes a passivating species. The passivating species is driven from the dummy layer into the gate dielectric layer. The dummy layer is removed. A metal gate electrode is formed over the gate dielectric layer after the dummy layer is removed.

A further embodiment is a structure. The structure includes a gate structure over a fin on a substrate. The gate structure includes a gate dielectric layer, a work-function tuning layer, and a metal gate electrode. The gate dielectric layer is along sidewalls and over a top surface of the fin. The gate dielectric layer includes fluorine. The work-function tuning layer is over the gate dielectric layer. The metal gate electrode is over the work-function tuning layer. At least one of the work-function tuning layer and the metal gate electrode is substantially free of fluorine.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a gate structure over a fin on a substrate, the gate structure comprising:
a gate dielectric layer along sidewalls and over a top surface of the fin, the gate dielectric layer comprising fluorine;
a capping layer over the gate dielectric layer;
a barrier layer over the capping layer;
a first work-function tuning layer over the barrier layer, the first work-function tuning layer having a non-zero concentration of fluorine;
a second work-function tuning layer over the first work-function tuning layer, the second work-function tuning layer having a non-zero concentration of fluorine that is greater than a non-zero concentration of fluorine in the barrier layer, that is greater than a non-zero concentration of fluorine in the capping layer and that is greater than a non-zero concentration of fluorine in the first work-function tuning layer, a barrier/adhesion layer over the second work-function tuning layer;

a metal gate electrode over the first work-function tuning layer, a concentration of fluorine in the gate dielectric layer being greater than a concentration of fluorine in the first work-function tuning layer and also being greater than a concentration of fluorine in the second work-function tuning layer; and the metal gate electrode being over the barrier/adhesion layer.

2. The structure of claim 1, wherein the gate dielectric layer has a gradient concentration of the fluorine, the gradient concentration decreasing in a direction from a region distal from the fin towards the fin.

3. The structure of claim 1 further comprising a metal between the gate dielectric layer and the first work-function tuning layer.

4. The structure of claim 1, wherein the gate structure is disposed between a first gate spacer and a second gate spacer, the first gate spacer and the second gate spacer being over the fin, the gate dielectric layer further being along respective sidewalls of the first gate spacer and the second gate spacer.

5. A structure comprising:
an interfacial layer over a channel region;
a fluorinated gate dielectric over the interfacial layer;
a capping layer over the fluorinated gate dielectric;
a barrier layer over the capping layer;
a first work function layer over the barrier layer, the first work function layer comprising fluorine;
a second work function layer over the first work function layer, the second work function layer comprising fluorine; and
a gate fill over the second work function layer, wherein the fluorinated gate dielectric has a higher concentration of fluorine than each of the first work function layer, the second work function layer, the interfacial layer and the capping layer and wherein the second work function layer has a fluorine concentration greater than the first work function layer, the barrier layer, and the capping layer.

6. The structure of claim 5, wherein the capping layer has amounts of fluorine.

7. The structure of claim 6 wherein the barrier layer comprises tantalum nitride.

8. The structure of claim 7, wherein the barrier layer has amounts of fluorine.

9. The structure of claim 5, wherein a peak concentration of fluorine in the capping layer is at an interface between the capping layer and the fluorinated gate dielectric.

10. The structure of claim 5, wherein a peak concentration of fluorine in the fluorinated gate dielectric is at an interface between the capping layer and the fluorinated gate dielectric.

11. The structure of claim 5, wherein a concentration of fluorine in the fluorinated gate dielectric is between 0.5 percent and 9 percent.

12. The structure of claim 5, wherein a thickness of the fluorinated gate dielectric is in a range from about 5 Å A to about 25 Å.

13. A structure comprising:
an interfacial layer over a channel region;
a fluorinated gate dielectric over the interfacial layer;
a capping layer over the fluorinated gate dielectric;
a barrier layer over the capping layer, the barrier layer comprising a first metal;
a first work function layer over the barrier layer and the capping layer, the first work function layer comprising a non-zero concentration of fluorine, wherein the non-zero concentration of fluorine within the first work function layer is less than a concentration of fluorine within the fluorinated gate dielectric;
a second work function layer over the first work function layer, the second work function layer comprising a non-zero concentration of fluorine, wherein the non-zero concentration of fluorine within the second work function layer is less than the concentration of fluorine within the fluorinated gate dielectric and wherein the non-zero concentration of fluorine within the second work function layer is greater than non-zero concentrations of fluorine within the first work function layer, the barrier layer, and the capping layer; and
a gate fill over the one or more work function layers, wherein the fluorinated gate dielectric has a gradient fluorine concentration decreasing from an interface between the fluorinated gate dielectric and the capping layer toward the interfacial layer.

14. The structure of claim 13, wherein the barrier layer comprises tantalum nitride.

15. The structure of claim 13, wherein the fluorinated gate dielectric comprises a fluorinated metal silicate.

16. The structure of claim 13, wherein the fluorinated gate dielectric has a thickness in a range from about 5 Å to about 25 Å.

17. The structure of claim 13, wherein the capping layer comprises titanium nitride, titanium-silicon nitride, titanium-carbon nitride, titanium-aluminum nitride, tantalum nitride, tantalum-silicon nitride, tantalum-carbon nitride, or aluminum nitride.

18. The structure of claim 13, wherein a peak concentration of fluorine in the barrier layer is higher than a lowest concentration of fluorine in the capping layer.

19. The structure of claim 13, wherein the non-zero concentration of fluorine within the barrier layer has a peak that is greater than the non-zero concentration of fluorine within the capping layer.

20. The structure of claim 13, wherein the first work function layer comprises titanium nitride, the barrier layer comprises tantalum nitride, and the capping layer comprises titanium nitride.

* * * * *